(12) United States Patent  
Kim

(10) Patent No.: US 8,604,843 B2
(45) Date of Patent: Dec. 10, 2013

(54) OUTPUT DRIVER

(75) Inventor: Kwang Soon Kim, Mokpo-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/489,827

(22) Filed: Jun. 6, 2012

(65) Prior Publication Data

US 2013/0169317 A1    Jul. 4, 2013

(30) Foreign Application Priority Data

Dec. 28, 2011    (KR) .................. 10-2011-0145225

(51) Int. Cl.
 *H03B 1/00* (2006.01)
 *H03K 3/00* (2006.01)

(52) U.S. Cl.
 USPC ........................................................ 327/108

(58) Field of Classification Search
 None
 See application file for complete search history.

(56) References Cited

U.S. PATENT DOCUMENTS 6,384,675 B1 *  5/2002  Ang et al. .................. 327/562
2002/0093366 A1 *  7/2002  Fotouhi ..................... 327/108

* cited by examiner

*Primary Examiner* — Daniel Rojas
(74) *Attorney, Agent, or Firm* — William Park & Associates Patent Ltd.

(57) ABSTRACT

An output driver includes, inter alia: a code generation unit disposed between a first node and a second node and configured to generate pull-up codes, according to a voltage difference between the first node and an output node, pull-down codes, according to a voltage difference between the output node and the second node, and a driving unit configured to drive the output node in response to a pull-up signal and a pull-down signal to generate output data, wherein a voltage level of the output data is controlled by a driving force which is set according to a combination of the pull-up and pull-down codes.

17 Claims, 6 Drawing Sheets

OUTPUT DRIVER

CROSS-REFERENCES TO RELATED APPLICATIONS

The present application claims priority under 35 U.S.C 119(a) to Korean Patent Application No. 10-2011-0145225, filed on Dec. 28, 2011, in the Korean Intellectual Property Office, which is incorporated herein by reference in its entirety set forth in full.

BACKGROUND

A semiconductor memory device has a function of driving output data with a driving force appropriate for external matters, by using an output driver when it is necessary to output data.

The driving force is a force for driving the voltage level of output data toward the levels of external voltages, VDD and VSS. As the driving force increases, the voltage level of output data approaches the levels of the specified external voltages, VDD and VSS. The driving force may be divided into a pull-up driving force as a force for driving the voltage level of an output signal toward the level of a power supply voltage VDD, and a pull-down driving force as a force for driving the voltage level of the output signal toward a ground voltage (VSS. In order to control the voltage of the output data outputted from an output driver to a desired level, it is necessary to control the driving force.

Since the driving force of the output driver may change due to variations in process, voltage and temperature (PVT) properties, the output driver is required to have a function that controls the driving force in conformity with variations in PVT properties.

FIG. 1 is a block diagram showing the configuration of a conventional output driver.

Referring to FIG. 1, the conventional output driver includes a driving unit 1 configured to pull-up drive or pull-down drive output data DOUT according to the level of input data DIN, and a fuse signal generation unit 2 configured to detect the level of the output data DOUT and generate fuse signals FUSE<1:N> in order to control the driving force of the driving unit 1.

In the conventional output driver configured in this way, the driving force is controlled according to the fuse signals FUSE<1:N> which are generated by the fuse signal generation unit 2, to cope with a change of the driving force due to variations in PVT properties. During a preliminary test, the level of the output data DOUT is detected and the fuses included in the fuse signal generation unit 2 are programmed, by which the driving force of the output driver is controlled.

However, in the conventional output driver, preliminary testing for controlling the driving force should be performed, and a fuse circuit should be provided, causing area utilization efficiency to deteriorate. Reprogramming after completion of programming of the fuse circuit is not an option.

SUMMARY

An embodiment of the present invention relates to an output driver which controls a driving force by detecting a difference between the levels of internal nodes, thereby obviating the need for performing a test.

Another embodiment of the present invention relates to an output driver which does not use a fuse circuit for controlling a driving force, thereby improving utilization efficiency.

Another embodiment of the present invention relates to an output driver which can continuously control a driving force even when the driving force varies during use.

In an embodiment, an output driver includes: a code generation unit disposed between a first node and a second node that is configured to generate pull-up codes, according to a voltage difference between the first node and an output node, and pull-down codes, according to a voltage difference between the output node and the second node, and a driving unit configured to drive the output node in response to a pull-up signal and a pull-down signal to generate output data, wherein a voltage level of the output data is controlled with a driving force, which is set according to a combination of the pull-up and pull-down codes.

In another embodiment, an output driver includes: a code generation unit disposed between a first node and an output node that is configured to detect a voltage difference between the first node and the output node to generate pull-up codes, and a driving unit configured to drive the output node in response to a pull-up signal to generate output data, wherein a voltage level of the output data is controlled with a driving force which is set according to a combination of the pull-up codes.

BRIEF DESCRIPTION OF THE DRAWINGS

The above and other aspects, features, and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
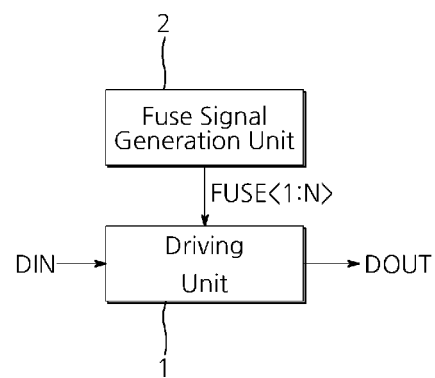
FIG. 1 is a block diagram showing the configuration of a conventional output driver.
Figure 2:
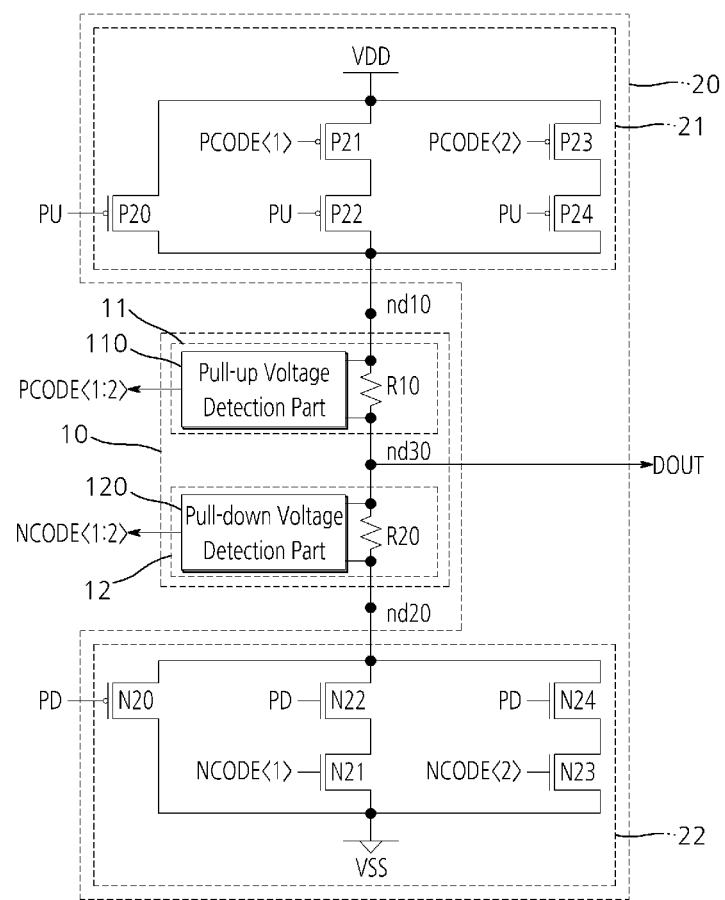
FIG. 2 is a block diagram showing the configuration of an output driver in accordance with an embodiment of the present invention.

FIG. 2 is a block diagram showing the configuration of an output driver in accordance with an embodiment of the present invention.

Referring to FIG. 2, the output driver according to the present embodiment includes a code generation unit 10 configured to generate pull-up codes PCODE<1:2> according to a voltage difference between a first node nd10 and an output node nd30, and generate pull-down codes NCODE<1:2> according to a voltage difference between a second node nd20 and the output node nd30. The embodiment also includes a driving unit 20 configured to generate output data DOUT by being inputted with a pull-up signal PU and a pull-down signal PD and driving the output node nd30. The level of the output data DOUT may be controlled via its driving force according to the combination of the pull-up codes PCODE<1:2> and the pull-down codes NCODE<1:2>.

The code generation unit 10 includes a pull-up code generating section 11 configured to detect the voltage difference between the first node nd10 and the output node nd30 to generate the pull-up codes PCODE<1:2>, and a pull-down code generating section 12 configured to detect the voltage difference between the second node nd20 and the output node nd30 to generate the pull-down codes NCODE<1:2>

The pull-up code generating section 11 includes a first resistor R10 disposed between the first node nd10 and the output node nd30, and a pull-up voltage detection part 110 configured to detect the voltage difference between the first node nd10 and the output node nd30 to generate the pull-up codes PCODE<1:2>.

The configuration of the pull-up voltage detection part 110 will be described below with reference to FIG. 3.

Figure 3:
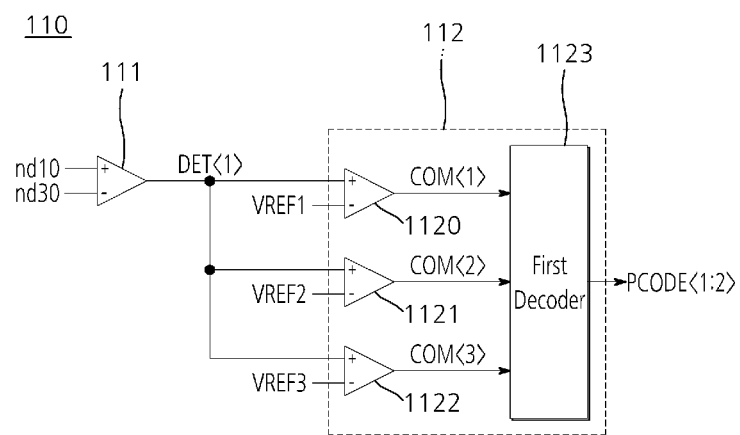
FIG. 3 is a view showing the pull-up code generating section included in the output driver shown in FIG. 2.

Referring to FIG. 3, the pull-up voltage detection part 110 includes a first amplifier 111, configured to amplify the voltage difference between the first node nd10 and the output node nd30 to generate a first detection signal DET<1>, and a first comparison stage 112 configured to compare the first detection signal DET<1> with first to third reference voltages VREF1 to VREF3 to generate the pull-up codes PCODE<1:2>. The first comparison stage 112 includes a first comparator 1120 configured to compare the first detection signal DET<1> with the first reference voltage VREF1 to generate a first comparison signal COM<1>, a second comparator 1121 configured to compare the first detection signal DET<1> with the second reference voltage VREF2 to generate a second comparison signal COM<2>, a third comparator 1122 configured to compare the first detection signal DET<1> with the third reference voltage VREF3 to generate a third comparison signal COM<3>, and a first decoder 1123 configured to decode the first to third comparison signals COM<1:3> to generate first and second pull-up codes PCODE<1:2>. The level of the first reference voltage VREF1 is set to the 3/4 level of a power supply voltage VDD, the level of the second reference voltage VREF2 is set to the 2/4 level of the power supply voltage VDD, and the level of the third reference voltage VREF3 is set to the 1/4 level of the power supply voltage VDD. Also, the initial voltage value of the output node nd30 is set to the 1/2 level of the power supply voltage VDD, and the initial combination of the first and second pull-up codes PCODE<1:2> is set such that the first pull-up code PCODE<1> is set to a logic low level and the second pull-up code PCODE<2> is set to a logic high level. It is to be noted that the levels of the first to third reference voltages VREF1 to VREF3 may be set in a variety of ways according to embodiments.

The logic levels of the first to third comparison signals COM<1:3> and the first and second pull-up codes PCODE<1:2>, which are set according to the level of the first detection signal DET<1>, will be described below.

In the case where the voltage level of the first detection signal DET<1> is higher than the level of the first reference voltage VREF1, the first to third comparison signals COM<1:3> are set to 'H, H, H'. 'H, H, H' of the first to third comparison signals COM<1:3> indicates that the first comparison signal COM<1> has a logic high level, the second comparison signal COM<2> has a logic high level, and the third comparison signal COM<3> has a logic high level. The first and second pull-up codes PCODE<1:2> are set to 'H, H'. 'H, H' of the first and second pull-up codes PCODE<1:2> indicates that the first pull-up code PCODE<1> has a logic high level and the second pull-up code PCODE<2> has a logic high level.

In the case where the voltage level of the first detection signal DET<1> is lower than the level of the first reference voltage VREF1 and higher than the level of the second reference voltage VREF2, the first to third comparison signals COM<1:3> are set to 'L, H, H'. 'L, H, H' of the first to third comparison signals COM<1:3> indicates that the first comparison signal COM<1> has a logic low level, the second comparison signal COM<2> has a logic high level, and the third comparison signal COM<3> has a logic high level. The first and second pull-up codes PCODE<1:2> are set to 'H, L'. 'H, L' of the first and second pull-up codes PCODE<1:2> indicates that the first pull-up code PCODE<1> has a logic high level and the second pull-up code PCODE<2> has a logic low level.

In the case where the voltage level of the first detection signal DET<1> is lower than the level of the second reference voltage VREF2 and higher than the level of the third reference voltage VREF3, the first to third comparison signals COM<1:3> are set to 'L, L, H'. 'L, L, H' of the first to third comparison signals COM<1:3> indicates that the first comparison signal COM<1> has a logic low level, the second comparison signal COM<2> has a logic low level, and the third comparison signal COM<3> has a logic high level. The first and second pull-up codes PCODE<1:2> are set to 'L, H'. 'L, H' of the first and second pull-up codes PCODE<1:2> indicates that the first pull-up code PCODE<1> has a logic low level and the second pull-up code PCODE<2> has a logic high level.

In the case where the voltage level of the first detection signal DET<1> is lower than the level of the third reference voltage VREF3, the first to third comparison signals COM<1:3> are set to 'L, L, L'. 'L, L, L' of the first to third comparison signals COM<1:3> indicates that the first comparison signal COM<1> has a logic low level, the second comparison signal COM<2> has a logic low level, and the third comparison signal COM<3> has a logic low level. The first and second pull-up codes PCODE<1:2> are set to 'L, L'. 'L, L' of the first and second pull-up codes PCODE<1:2> indicates that the first pull-up code PCODE<1> has a logic low level and the second pull-up code PCODE<2> has a logic low level.

Referring back to FIG. 2, the pull-down code generating section 12 includes a second resistor R20 disposed between the second node nd20 and the output node nd30, and a pull-down voltage detection part 120 configured to detect the voltage difference between the second node nd20 and the output node nd30 to generate the pull-down codes NCODE<1:2>.

The configuration of the pull-down voltage detection part 120 will be described below with reference to FIG. 4.

Figure 4:
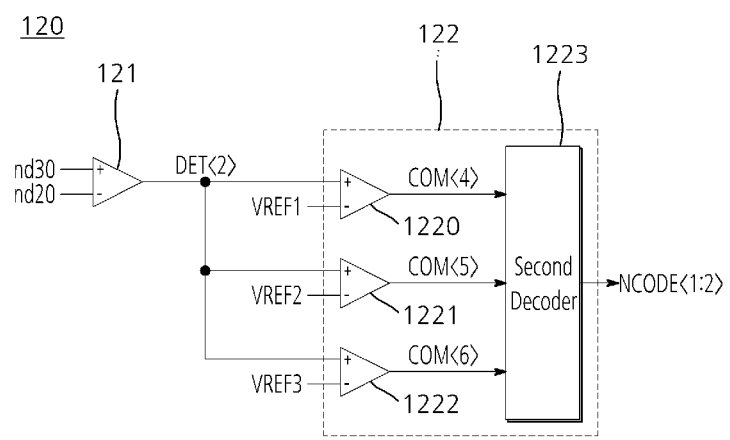
FIG. 4 is a view showing the pull-down code generating section included in the output driver shown in FIG. 2.

Referring to FIG. 4, the pull-down voltage detection part 120 includes a second amplifier 121 configured to amplify the voltage difference between the second node nd20 and the output node nd30 to generate a second detection signal DET<2>, and a second comparison stage 122 configured to compare the second detection signal DET<2> with first to third reference voltages VREF1 to VREF3 to generate the pull-down codes NCODE<1:2>. The second comparison stage 122 includes a fourth comparator 1220 configured to compare the second detection signal DET<2> with the first reference voltage VREF1 to generate a fourth comparison signal COM<4>, a fifth comparator 1221 configured to compare the second detection signal DET<2> with the second reference voltage VREF2 to generate a fifth comparison signal COM<5>, a sixth comparator 1222 configured to compare the second detection signal DET<2> with the third reference voltage VREF3 to generate a sixth comparison signal COM<6>, and a second decoder 1223 configured to decode the fourth to sixth comparison signals COM<4:6> to generate first and second pull-down codes NCODE<1:2>. The level of the first reference voltage VREF1 is set to the 3/4 level of the power supply voltage VDD, the level of the second reference voltage VREF2 is set to the 2/4 level of the power supply voltage VDD, and the level of the third reference voltage VREF3 is set to the 1/4 level of the power supply voltage VDD. Also, the initial voltage value of the output node nd30 is set to the 1/2 level of the power supply voltage VDD, and the initial combination of the first and second pull-down codes NCODE<1:2> is set such that the first pull-down code NCODE<1> is set to a logic high level and the second pull-down code NCODE<2> is set to a logic low level. It is to be noted that the levels of the first to third reference voltages VREF1 to VREF3 may be set in a variety of ways according to embodiments.

The logic levels of the fourth to sixth comparison signals COM<4:6> and the first and second pull-down codes NCODE<1:2>, which are set according to the level of the second detection signal DET<2>, will be described below.

In the case where the voltage level of the second detection signal DET<2> is higher than the level of the first reference voltage VREF1, the fourth to sixth comparison signals COM<4:6> are set to 'H, H, H'. 'H, H, H' of the fourth to sixth comparison signals COM<4:6> indicates that the fourth comparison signal COM<4> has a logic high level, the fifth comparison signal COM<5> has a logic high level, and the sixth comparison signal COM<6> has a logic high level. The first and second pull-down codes NCODE<1:2> are set to 'L, L'. 'L, L' of the first and second pull-down codes NCODE<1:2> indicates that the first pull-down code NCODE<1> has a logic low level and the second pull-down code NCODE<2> has a logic low level.

In the case where the voltage level of the second detection signal DET<2> is lower than the level of the first reference voltage VREF1 and higher than the level of the second reference voltage VREF2, the fourth to sixth comparison signals COM<4:6> are set to 'L, H, H'. 'L, H, H' of the fourth to sixth comparison signals COM<4:6> indicates that the fourth comparison signal COM<4> has a logic low level, the fifth comparison signal COM<5> has a logic high level, and the sixth comparison signal COM<6> has a logic high level. The first and second pull-down codes NCODE<1:2> are set to 'L, H'. 'L, H' of the first and second pull-down codes NCODE<1:2> indicates that the first pull-down code NCODE<1> has a logic low level and the second pull-down code NCODE<2> has a logic high level.

In the case where the voltage level of the second detection signal DET<2> is lower than the level of the second reference voltage VREF2 and higher than the level of the third reference voltage VREF3, the fourth to sixth comparison signals COM<4:6> are set to 'L, L, H'. 'L, L, H' of the fourth to sixth comparison signals COM<4:6> indicates that the fourth comparison signal COM<4> has a logic low level, the fifth comparison signal COM<5> has a logic low level, and the sixth comparison signal COM<6> has a logic high level. The first and second pull-down codes NCODE<1:2> are set to 'H, L'. 'H, L' of the first and second pull-down codes NCODE<1:2> indicates that the first pull-down code NCODE<1> has a logic high level and the second pull-down code NCODE<2> has a logic low level.

In the case where the voltage level of the second detection signal DET<2> is lower than the level of the third reference voltage VREF3, the fourth to sixth comparison signals COM<4:6> are generated to 'L, L, L'. 'L, L, L' of the fourth to sixth comparison signals COM<4:6> indicates that the fourth comparison signal COM<4> has a logic low level, the fifth comparison signal COM<5> has a logic low level, and the sixth comparison signal COM<6> has a logic low level. The first and second pull-down codes NCODE<1:2> are set to 'H, H'. 'H, H' of the first and second pull-down codes NCODE<1:2> indicates that the first pull-down code NCODE<1> has a logic high level and the second pull-down code NCODE<2> has a logic high level.

Referring back to FIG. 2, the driving unit 20 includes a pull-up driving section 21 configured to be inputted by the pull-up signal PU and the first and second pull-up codes PCODE<1:2> to pull-up drive the output data DOUT to the level of the power supply voltage VDD, and a pull-down driving section 22 configured to be inputted by the pull-down signal PD and the first and second pull-down codes NCODE<1:2> to pull-down drive the output data DOUT to the level of the ground voltage VSS.

The pull-up driving section 21 includes transistors P20, P22, and P24 for pull-up driving the output node nd30 according to the pull-up signal PU, and transistors P21 and P23 for driving the output node nd30 with a driving force set according to the combination of the first and second pull-up codes PCODE<1:2>, to control the level of the output data DOUT. The size of the transistor P21 may be set to be larger than the size of the transistor P23 so as to have a larger driving force.

The pull-down driving section 22 includes transistors N20, N22, and N24 for pull-down driving the output node nd30 according to the pull-down signal PD, and transistors N21 and N23 for driving the output node nd30 with a driving force set according to the combination of the first and second pull-down codes NCODE<1:2>, to control the driving force of the output data DOUT. The size of the transistor N21 may be set to be larger than the size of the transistor N23 so as to have a larger driving force.

Figure 5:
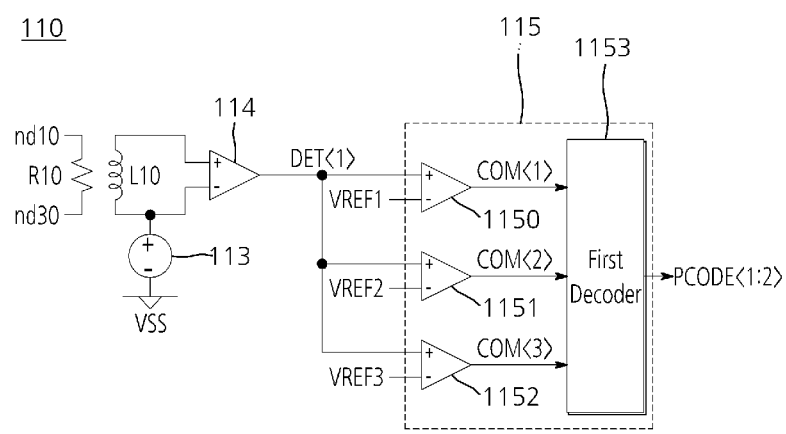
FIG. 5 is a view showing a variation of the pull-up code generating section included in the output driver shown in FIG. 2.

FIG. 5 is a view showing a variation of the pull-up code generating section included in the output driver shown in FIG. 2.

Referring to FIG. 5, the pull-up voltage detection part 110 includes a first inductor L10 disposed adjacent to the first resistor R10, with varying inductance based on the amount of current flowing through itself and the first resistor R10, a first current source 113 connected between the first inductor L10 and a ground voltage VSS, a first amplifier 114 configured to amplify the voltage difference between the first inductor L10 and the first current source 113 to generate a first detection signal DET<1>, and a first comparison stage 115 configured to compare the first detection signal DET<1> with first to third reference voltages VREF1 to VREF3 to generate first and second pull-up codes PCODE<1:2>. The first comparison stage 115 includes a first comparator 1150 configured to compare the first detection signal DET<1> with the first reference voltage VREF1 to generate a first comparison signal COM<1>, a second comparator 1151 configured to compare the first detection signal DET<1> with the second reference voltage VREF2 to generate a second comparison signal COM<2>, a third comparator 1152 configured to compare the first detection signal DET<1> with the third reference voltage VREF3 to generate a third comparison signal COM<3>, and a first decoder 1153 configured to decode the first to third comparison signals COM<1:3> to generate the first and second pull-up codes PCODE<1:2>. The level of the first reference voltage VREF1 is set to the 3/4 level of a power supply voltage VDD, the level of the second reference voltage VREF2 is set to the 2/4 level of the power supply voltage VDD, and the level of the third reference voltage VREF3 is set to the 1/4 level of the power supply voltage VDD. It is to be noted that the levels of the first to third reference voltages VREF1 to VREF3 may be set in a variety of ways according to embodiments.

Figure 6:
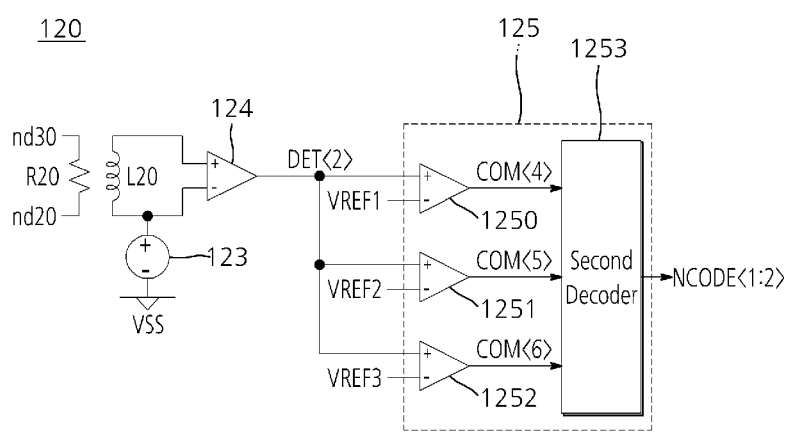
FIG. 6 is a view showing a variation of the pull-down code generating section included in the output driver shown in FIG. 2.

FIG. 6 is a view showing another variation of the pull-down code generating section included in the output driver shown in FIG. 2.

Referring to FIG. 6, the pull-down voltage detection part 120 includes a second inductor L20 disposed adjacent to the second resistor R20, with varying inductance based on the amount of current flowing through itself and the second resistor R20, a second current source 123 connected between the first inductor L20 and the ground voltage VSS, a second amplifier 124 configured to amplify the voltage difference between the second inductor L20 and the second current source 123 to generate a second detection signal DET<2>, and a second comparison stage 125 configured to compare the second detection signal DET<2> with the first to third reference voltages VREF1 to VREF3 to generate first and second pull-down codes NCODE<1:2>. The second comparison stage 125 includes a fourth comparator 1250 configured to compare the second detection signal DET<2> with the first reference voltage VREF1 to generate a fourth comparison signal COM<4>, a fifth comparator 1251 configured to compare the second detection signal DET<2> with the second reference voltage VREF2 to generate a fifth comparison signal COM<5>, a sixth comparator 1252 configured to compare the second detection signal DET<2> with the third reference voltage VREF3 to generate a sixth comparison signal COM<6>, and a second decoder 1253 configured to decode the fourth to sixth comparison signals COM<4:6> to generate the first and second pull-down codes NCODE<1:2>. The level of the first reference voltage VREF1 is set to the 3/4 level of a power supply voltage VDD, the level of the second reference voltage VREF2 is set to the 2/4 level of the power supply voltage VDD, and the level of the third reference voltage VREF3 is set to the 1/4 level of the power supply voltage VDD. It is to be noted that the levels of the first to third reference voltages VREF1 to VREF3 may be set in a variety of ways according to embodiments.

Operations of the output driver configured as described above will be described below in the case where in order to decrease a driving force which increases due to variations in PVT properties, the first and second detection signals DET<1:2> are generated to have levels lower than the first reference voltage VREF1 and higher than the second reference voltage VREF2.

First, the initial values of the first and second pull-up codes PCODE<1:2> are set such that the first pull-up code PCODE<1> has a logic low level and the second pull-up code PCODE<2> has a logic high level. In the pull-up driving section 21, if the pull-up signal PU is inputted by a logic low level, the transistors P20, P22 and P24 are turned on, and the first node nd10 is pull-up driven with the driving force of the transistors P20, P21 and P22. Accordingly, a voltage difference corresponding to the driving force of the transistors P20, P21 and P22 is induced between both ends of the first resistor R10.

However, in the event that the voltage difference between both ends of the first resistor R10 increases due to variations in PVT properties, the first amplifier 111 of the pull-up voltage detection part 110 amplifies the voltage difference between the first node nd10 and the output node nd30 to generate the first detection signal DET<1> at a level of which is lower than the first reference voltage VREF1 and higher than the second reference voltage VREF2. When the voltage level of the first detection signal DET<1> is lower than the level of the first reference voltage VREF1 and higher than the level of the second reference voltage VREF2, the first to third comparators 1120 to 1122 of the first comparison stage 112 generate the first to third comparison signals COM<1:3> of 'L, H, H'. 'L, H, H' of the first to third comparison signals COM<1:3> indicates that the first comparison signal COM<1> has a logic low level, the second comparison signal COM<2> has a logic high level, and the third comparison signal COM<3> has a logic high level. The first decoder 1123 decodes the first to third comparison signals COM<1:3> to generate the first and second pull-up codes PCODE<1:2> of 'H, L'. 'H, L' of the first and second pull-up codes PCODE<1:2> indicates that the first pull-up code PCODE<1> has a logic high level and the second pull-up code PCODE<2> has a logic low level.

According to the first and second pull-up codes PCODE<1:2> of 'H, L', the transistor P21 of the pull-up driving section 21 is turned off, and the transistor P23 of the pull-up driving section 21 is turned on. Since the transistors P20, P22 and P24 of the pull-up driving section 21 are turned on when PU has a logic low level, the pull-up driving section 21 pull-up drives the first node nd10 with the driving force of the transistors P20, P23, and P24. In other words, as the transistor P21 with a larger driving force is turned off and the transistor P23 with a smaller driving force is turned on, the driving force of the pull-up driving section 21 decreases. Therefore, as the voltage difference between the first node nd10 and the output node nd30 decreases, the level of the output data DOUT is reduced. When the driving unit 20 is pull-up driven, the pull-down code generating section 12 and the pull-down driving section 22 are not driven.

The initial values of the first and second pull-down codes NCODE<1:2> are set such that the first pull-down code NCODE<1> has a logic high level and the second pull-down code NCODE<2> has a logic low level. In the pull-down driving section 22, if the pull-down signal PD is inputted by a logic high level, the transistors N20, N22 and N24 are turned on, and the second node nd20 is pull-down driven with the driving force of the transistors N20, N21 and N22. Accordingly, a voltage difference corresponding to the driving force of the transistors N20, N21 and N22 is induced between both ends of the second resistor R20.

However, in the event that the voltage difference between both ends of the second resistor R20 increases due to variations in PVT properties, the second amplifier 121 of the pull-down voltage detection part 120 amplifies the voltage difference between the second node nd20 and the output node nd30 to generate the second detection signal DET<2> at a level of which is lower than the first reference voltage VREF1 and higher than the second reference voltage VREF2. When the voltage level of the second detection signal DET<2> is lower than the level of the first reference voltage VREF1 and higher than the level of the second reference voltage VREF2, the fourth to sixth comparators 1220 to 1222 of the second comparison stage 122 generate the fourth to sixth comparison signals COM<4:6> of 'L, H, H'. 'L, H, H' of the fourth to sixth comparison signals COM<4:6> indicates that the fourth comparison signal COM<4> has a logic low level, the fifth comparison signal COM<5> has a logic high level, and the sixth comparison signal COM<6> has a logic high level. The second decoder 1223 decodes the fourth to sixth comparison signals COM<4:6> to generate the first and second pull-down codes NCODE<1:2> of 'L, H'. 'L, H' of the first and second pull-down codes NCODE<1:2> indicates that the first pull-down code NCODE<1> has a logic low level and the second pull-down code NCODE<2> has a logic high level.

According to the first and second pull-down codes NCODE<1:2> of 'L, H', the transistor N21 of the pull-down driving section 22 is turned off, and the transistor N23 of the pull-down driving section 22 is turned on. Since the transistors N20, N22 and N24 of the pull-down driving section 22 are turned on, the pull-down driving section 22 pull-down drives the second node nd20 with the driving force of the transistors N20, N23, and N24. In other words, as the transistor N21 with a larger driving force is turned off and the transistor N23 with a smaller driving force is turned on, the driving force of the pull-down driving section 22 decreases. Therefore, as the voltage difference between the second node nd20 and the output node nd30 decreases, the level of the output data DOUT is reduced. When the driving unit 20 is pull-down driven, the pull-up code generating section 11 and the pull-up driving section 21 are not driven.

As is apparent from the above descriptions, the output driver according to the embodiment of the present invention provides advantages in that, since a driving force is controlled by detecting the level difference of internal nodes, it is possible to cope with a change of the driving force due to variations in PVT properties without the need of separately performing a test. Unnecessary use of an area may be avoided because a fuse is not employed, and the driving force may be continuously controlled during operation.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. An output driver comprising:
    a code generation unit disposed between a first node and a second node and configured to generate pull-up codes, according to a voltage difference between the first node and an output node, and pull-down codes, according to a voltage difference between the output node and the second node; and
    a driving unit configured to drive the output node in response to a pull-up signal and a pull-down signal to generate output data,
    wherein a voltage level of the output data is controlled by a driving force which is set according to a combination of the pull-up and pull-down codes.

2. The output driver according to claim 1, wherein the code generation unit comprises:
    a pull-up code generating section configured to detect the voltage difference between the first node and the output node to generate the pull-up codes; and
    a pull-down code generating section configured to detect the voltage difference between the output node and the second node to generate the pull-down codes.

3. The output driver according to claim 2, wherein the pull-up code generating section comprises:
    a first resistor disposed between the first node and the output node; and
    a pull-up voltage detection part configured to detect the voltage difference between the first node and the output node to generate the pull-up codes.

4. The output driver according to claim 3, wherein the pull-up voltage detection part comprises:
    a first amplifier configured to amplify the voltage difference between the first node and the output node to generate a first detection signal; and
    a first comparison stage configured to compare levels of the first detection signal with reference voltages to generate the pull-up codes.

5. The output driver according to claim 4, wherein the first comparison stage comprises a plurality of comparators configured to compare the first detection signal with the reference voltages to generate comparison signals.

6. The output driver according to claim 5, wherein the first comparison stage further comprises a first decoder configured to decode the comparison signals to generate the pull-up codes.

7. The output driver according to claim 2, wherein the pull-down code generating section comprises:
    a second resistor disposed between the output node and the second node; and
    a pull-down voltage detection part configured to detect the voltage difference between the output node and the second node to generate the pull-down codes.

8. The output driver according to claim 7, wherein the pull-down voltage detection part comprises:
    a second amplifier configured to amplify the voltage difference between the output node and the second node to generate a second detection signal; and
    a second comparison stage configured to compare levels of the second detection signal with reference voltages to generate the pull-down codes.

9. The output driver according to claim 8, wherein the second comparison stage comprises a plurality of comparators configured to compare the second detection signal with the reference voltages to generate comparison signals.

10. The output driver according to claim 9, wherein the second comparison stage further comprises a second decoder configured to decode the comparison signals to generate the pull-down codes.

11. The output driver according to claim 3, wherein the pull-up voltage detection part comprises:
    a first inductor disposed adjacent to the first resistor;
    a first current source connected between the first inductor and a ground voltage;
    a first amplifier configured to amplify a voltage difference between the first inductor and the first current source to generate a first detection signal; and
    a first comparison stage configured to compare levels of the first detection signal with reference voltages to generate the pull-up codes.

12. The output driver according to claim 11, wherein the first comparison stage comprises a plurality of comparators configured to compare the first detection signal with the reference voltages to generate comparison signals.

13. The output driver according to claim 12, wherein the first comparison stage further comprises a first decoder configured to decode the comparison signals to generate the pull-up codes.

14. The output driver according to claim 7, wherein the pull-down voltage detection part comprises:
    a second inductor disposed adjacent to the second resistor;
    a second current source connected between the second inductor and the ground voltage;
    a second amplifier configured to amplify a voltage difference between the second inductor and the second current source to generate a second detection signal; and
    a second comparison stage configured to compare levels of the second detection signal with reference voltages to generate the pull-down codes.

15. The output driver according to claim 14, wherein the second comparison stage comprises a plurality of comparators configured to compare the second detection signal with the reference voltages to generate comparison signals.

16. The output driver according to claim 15, wherein the second comparison stage further comprises a second decoder configured to decode the comparison signals to generate the pull-down codes.

17. The output driver according to claim 1, wherein the driving unit comprises:

a pull-up driving section configured to be controlled by a driving force according to a combination of the pull-up codes in response to the pull-up signal to pull-up drive the output data via a plurality of transistors; and a pull-down driving section configured to be controlled by a driving force according to a combination of the pull-down codes in response to the pull-down signal to pull-down drive the output data via a plurality of transistors.

\* \* \* \* \*